(12) United States Patent
Damlencourt

(10) Patent No.: US 7,601,570 B2
(45) Date of Patent: Oct. 13, 2009

(54) METHOD FOR PRODUCING A DEVICE COMPRISING A STRUCTURE EQUIPPED WITH ONE OR MORE MICROWIRES OR NANOWIRES BASED ON A SI AND GE COMPOUND BY GERMANIUM CONDENSATION

(75) Inventor: Jean-Francois Damlencourt, Laval (FR)

(73) Assignee: Commissariat a l'Energie Atomique, Paris (FR)

( * ) Notice: Subject to any disclaimer, the term of this patent is extended or adjusted under 35 U.S.C. 154(b) by 69 days.

(21) Appl. No.: 11/832,904

(22) Filed: Aug. 2, 2007

(65) Prior Publication Data

US 2008/0050918 A1   Feb. 28, 2008

(30) Foreign Application Priority Data

Aug. 25, 2006  (FR) .................................. 06 53471

(51) Int. Cl.
*H01L 21/331* (2006.01)
(52) U.S. Cl. .................. 438/149; 257/E21.372
(58) Field of Classification Search ............... 438/197, 438/694, 933, 149; 257/401
See application file for complete search history.

(56) References Cited

U.S. PATENT DOCUMENTS

| 7,015,078 B1 | 3/2006 | Xiang et al. |
| 2004/0166642 A1 | 8/2004 | Chen et al. |
| 2006/0276052 A1 | 12/2006 | Morand et al. |
| 2008/0135949 A1* | 6/2008 | Lo et al. ............... 257/401 |

FOREIGN PATENT DOCUMENTS

| FR | 2 884 648 A1 | 10/2006 |
| FR | 2 886 763 A1 | 12/2006 |
| WO | WO 2006-108987 | 10/2006 |

OTHER PUBLICATIONS

Damlencourt et al., "Fabrication of SiGe-On-Insulator by Improved Ge condensation technique", Sige Technology and Device Meeting 2006 ISTDM 2006. Third International. 1-2, May 15-17, 2006.*
Tsung-Yang Liow, et al., "Investigation of Silicon-Germanium Fins Fabricated Using Germanium Condensation on Vertical Compliant Structures", Applied Physics Letters, vol. 87 No. 26, XP-012077069, Dec. 19, 2005, pp. 262104-1-262104-3.

(Continued)

*Primary Examiner*—W. David Coleman
*Assistant Examiner*—Daniel Shook
(74) *Attorney, Agent, or Firm*—Oblon, Spivak, McClelland, Maier & Neustadt, L.L.P.

(57) ABSTRACT

A method for producing a microelectronic device having one or more $Si_{1-z}Ge_z$ based semiconductor wire(s) (with $0<z\leq1$), including:
 a) thermal oxidation of at least a portion of a $Si_{1-x}Ge_x$-based semiconductor layer (with $0<x<1$) resting on a support, so as to form at least one $Si_{1-y}Ge_y$-based semiconductor zone (with $0<y<1$ and $x<y$),
 b) lateral thermal oxidation of the sides of one or more so-called semiconductor connection blocks from the $Si_{1-y}Ge_y$-based semiconductor zone and connecting a semiconductor block intended to form a transistor source region and another block intended to form a transistor drain region so as to reduce the semiconductor connection blocks in at least one direction parallel to the main plane of the support and to form one or more $Si_{1-z}Ge_z$-based semiconductor wire(s) (with $0<y<1$ and $y<z$).

20 Claims, 4 Drawing Sheets

OTHER PUBLICATIONS

Tsutomu Tezuka, et al., "High-Mobility Strained SiGe-on-Insulator pMOSFETs With Ge-Rich Surface Channels Fabricated by Local Condensation Technique", IEEE Electron Device Letters, vol. 26 No. 4, XP-001230451, Apr. 2005, pp. 243-245.

J. I. Liu, et al., "Fabrication of Silicon Quantum Wires by Anisotropic Wet Chemical Etching and Thermal Oxidation", Journal of Vacuum Science and Technology-B, vol. 13 No. 5, XP-002426481, Sep. 1995, pp. 2137-2138.

Tsutomu Tezuka, et al. "A Novel Fabrication Technique of Ultrathin and Relaxed SiGe Buffer Layers with High Ge Fraction for Sub-100 nm Strained Silicon-on-Insulator MOSFETs", Jpn. J. Appl. Phys., vol. 40 No. 4B, Apr. 2001, pp. 2866-2874.

Tsutomu Tezuka, et al, "Selectively-Formed High Mobility SiGe-on-Insulator pMOSFETs with Ge-rich Strained Surface Channels Using Local Condensation Technique", Symposium on VLSI Technology Digest of Technical Papers, 2004, pp. 198-199.

Jean-Pierre Colinge, "Multiple-Gate SOI MOSFETs", Solid-State Electronics, vol. 48, 2004, pp. 897-905.

B. Doyle, et al., "Tri-Gate Fully-Depleted CMOS Transistors: Fabrication Design and Layout", Symposium on VLSI Technology Digest of Technical Papers, 2003, pp. 133-134.

Meikei Leong, et al., Silicon Device Scaling to the Sub-10-nm Regime, Science, vol. 306, Dec. 17, 2004, pp. 2057-2060.

Yue Wu, et al., "Single-Crystal Metallic Nanowires and Metal/Semiconductor Nanowire Heterostructures", Letters to nature, vol. 430, Jul. 1, 2004, pp. 61-65 and 704.

Shu Nakaharai, et al., "Characterization of 7-nm-Thick Strained Ge-on-Insulator Layer Fabricated by Ge-Condensation Technique", Applied Physics Letters, vol. 83 No. 17, Oct. 27, 2003, pp. 3516-3518.

Jingyun Huang, et al.,"Calculation of Critical Layer Thickness Considering Thermal Strain in $Si_{1-x}GE_x$/Si Strained-Layer Heterostructures", J. Appl. Phys. vol. 83 No. 1, Jan. 1, 1998, pp. 171-173.

\* cited by examiner

METHOD FOR PRODUCING A DEVICE COMPRISING A STRUCTURE EQUIPPED WITH ONE OR MORE MICROWIRES OR NANOWIRES BASED ON A SI AND GE COMPOUND BY GERMANIUM CONDENSATION

TECHNICAL FIELD

This invention relates to a method for producing an improved microelectronic device in which $Si_{1-z}Ge_z$-based semiconductor nanowires (with z>0) are formed, using at least one first step of thermal oxidation of one or more semiconductor zones based on a silicon and germanium compound, and at least one step of lateral thermal oxidation of one or more semiconductor zones based on another silicon and germanium compound resulting from the first oxidation.

This invention relates more specifically to transistors, and is intended to present a transistor equipped in particular with a channel or multi-channel structure in the form of one or more $Si_{1-z}Ge_z$-based nanowire(s), connecting a semiconductor zone intended to act as a drain region. Such a structure can be adapted to so-called "embedded" gate structures. The problem to be solved is that of finding a new method for producing a microelectronic device comprising a structure equipped with one or more semiconductor wires based on germanium or a Si and Ge compound having a high germanium content.

PRIOR ART

A semiconductor nanowire channel and embedded gate structure makes it possible to obtain a transistor of reduced size in which the electrostatic control of the inversion charge is improved. The rules for sizing integrated circuits and the physical operation limitations of nanometric transistors (short channel effects, tunnel current in the insulator) have increasingly led to the production of transistors equipped with a double or triple gate, such as "Finfet" and tri-gate transistors, of which the channel structure can be in the form of one or more separate semiconductor rods or semiconductor wires.

A known method for forming semiconductor wires is growth by CVD (for Chemical Vapour Deposition). Such a method makes it possible to obtain a superior crystalline quality and a superior control of the wire diameter than those obtained by etching. It is thus possible to produce heterojunctions of IV-IV and III-V materials, in the sense of wire growth, so as to make it possible to carry out numerous applications using transport properties as well as optical properties. However, with such a method, it is difficult to control the shape of the wires and precisely position them.

Another method for producing semiconductor wires consists of growing these wires on the sides of a stack of thin layers. This approach however requires the implementation of complex techniques of lithography, selective epitaxy and selective isotropic etching.

In addition, as pure germanium has a mobility two times higher for electrons and four times higher for holes than silicon, it is increasingly sought to produce microelectronic devices equipped with channels based on germanium or a silicon and germanium compound in which the germanium content is high. A disadvantage of transistors equipped with a channel formed in a germanium-based substrate is the high cost of the substrate. In addition, it is very difficult to produce channels with germanium or a SiGe alloy rich in Ge having a good crystalline quality by epitaxy. The production of Ge transistors requires numerous adaptations due to the instability of the germanium oxide. By way of example, it is currently difficult to produce good metallic contacts on source and drain zones constituted by a SiGe material with a Ge composition higher than 30%.

In document FR 0505701, a method for producing a transistor device equipped with a germanium-enriched channel structure is described. The method includes: the production, on a substrate, of a stack of layers based on germanium and silicon compound, having different germanium concentrations with respect to one another, delimitation by etching in said stack of a zone intended to act as a channel zone, superficial and lateral thermal oxidation of the zone intended to act as a channel zone, so as to form a germanium-enriched channel.

The problem to be solved is that of finding a new method for producing a microelectronic device equipped with $Si_{1-z}Ge_z$-based semiconductors based on having a high germanium concentration.

DESCRIPTION OF THE INVENTION

This invention is intended to overcome the disadvantages mentioned above and to produce a "wire"-type channel structure made of Ge or an alloy of silicon and Ge of micro or nanometric size on an insulator by germanium condensation.

The invention relates in particular to the production of a microelectronic device comprising one or more $Si_{1-z}Ge_z$-based semiconductor wire(s) (with $0<z\leq1$), including the steps of:

a) thermal oxidation of at least a portion of a $Si_{1-x}Ge_x$-based semiconductor layer (with $0<x<1$) resting on a support, so as to form at least one $Si_{1-y}Ge_y$-based semiconductor zone (with $0<y<1$ and x<y), b) lateral thermal oxidation of the sides of one or more so-called semiconductor "connection" blocks from said $Si_{1-y}Ge_y$-based semiconductor zone and connecting a semiconductor block intended to form a transistor source region and another block intended to form a transistor drain region so as to reduce the semiconductor connection blocks in at least one direction parallel to the main plane of the support and to form one or more $Si_{1-z}Ge_z$-based semiconductor wire(s) (with $0<y<1$ and y<z) connecting the semiconductor intended to form a transistor source region and the other block intended to form a transistor drain region.

This invention also relates to a method for producing a microelectronic device comprising one or more $Si_{1-z}Ge_z$-based semiconductor wire(s) (with $0<z\leq1$), including the steps of:

a) lateral thermal oxidation of the sides of one or more semiconductor "connection" blocks from a $Si_{1-x}Ge_x$-based semiconductor layer (with $0<x<1$) resting on a support and connecting a semiconductor block intended to form a transistor source region and another block intended to form a transistor drain region so as to reduce the semiconductor connection blocks in at least one direction parallel to the main plane of the support and to form one or more $Si_{1-y}Ge_y$-based semiconductor wire(s).

b) thermal oxidation of at least a portion of the semiconductor layer, so as to form at least one $Si_{1-y}Ge_y$-based semiconductor zone comprising the semiconductor connection blocks, with the semiconductor of the wires then being based on $Si_{1-z}Ge_z$ (with $0<y<1$ et y<z).

The $Si_{1-x}Ge_x$-based semiconductor layer can rest on a Si-based layer.

The support can be a SOI substrate and the Si-based layer can belong to said SOI substrate and rest on a buried oxide layer of the SOI substrate.

The $Si_{1-x}Ge_x$-based semiconductor layer can be covered with another Si-based layer.

According to another possibility, the thermal oxidation of at least a portion of the semiconductor layer can be an oxidation of the entire semiconductor layer.

According to an alternative, the thermal oxidation of at least a portion of the semiconductor layer can be a localised oxidation of the semiconductor layer, performed through at least one opening of an oxidation mask.

According to one implementation, between step a) and step b), the method can also include the step of:

etching the $Si_{1-y}Ge_y$-based semiconductor zone, or the semiconductor layer, through a mask, so as to produce the semiconductor connection block(s) and the semiconductor block intended to form the transistor source region and the other semiconductor block intended to form a transistor drain region.

In the step of lateral thermal oxidation of the sides of one or more block(s), the semiconductor connection block(s), the semiconductor block intended to form the transistor source region and the other semiconductor block intended to form a transistor drain region can be superimposed by an oxidation mask.

According to one possibility, the oxidation mask can cover the sides of the semiconductor block intended to form a source region and the semiconductor block intended to form a drain region.

BRIEF DESCRIPTION OF THE DRAWINGS

This invention can be better understood on reading the following description of example embodiments, provided purely for indicative and non-limiting purposes, in reference to the appended drawings in which.

Identical, similar or equivalent parts of the different figures can have the same numeric references for the sake of consistency between figures.

The different parts shown in the figures are not necessarily shown according to a uniform scale, so as to make the figures easier to read.

DETAILED DESCRIPTION OF SPECIFIC EMBODIMENTS

An example of a method, according to the invention, for producing a microelectronic device equipped with one or more $Si_{1-z}Ge_z$-based semiconductor wire(s) (with $0<z\leq1$), will now be given in reference to FIGS. 1A to 1E.

Figure 1A:
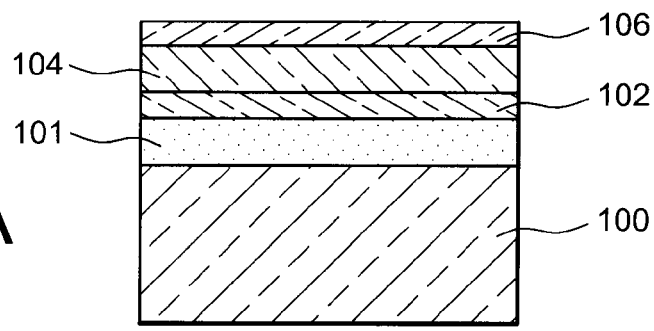
FIGS. 1A to 1E show a first example of a method according to the invention for producing a microelectronic device equipped with one or more $Si_{1-z}Ge_z$-based semiconductor wire(s) capable of forming a transistor channel structure.

The starting material of the method can be a semiconductor-type substrate on an insulator, for example SOI (for silicon on insulator) including a support layer 100, for example based on Si, covered with a dielectric material layer 101, for example a buried oxide layer itself covered with a thin semiconductor layer 102 that can be based on Si, with a thickness between for example 5 and 100 nanometers or, for example, on the order of 20 nanometers. On the first thin semiconductor layer 102, another semiconductor layer 104 based on $Si_{1-x}Ge_x$, with $0<x<y\leq1$, with x for example on the order of 0.1 or between 0.01 and 0.05, is formed. The semiconductor $Si_{1-x}Ge_x$-based layer 104 can be produced for example by epitaxy, and have a thickness below the critical plastic relaxation thickness, i.e. a SiGe-based layer that is strained, or between 5 and 200 nm or for example between 10 and 75 nanometers. On the $Si_{1-x}Ge_x$-based semiconductor layer 104, a second thin Si-based layer 106 can be produced. The second thin layer 106 can, for example, have a thickness between 0 and 10 nm and be formed by epitaxy (FIG. 1A).

Then, a step of condensation of the germanium of the $Si_{1-x}Ge_x$-based semiconductor layer 104 is performed, for example by an oxidation method as described in the document: "A novel fabrication technique of ultrathin and relaxed SiGe buffer layers with high Ge fraction for sub-100 nm strained silicon on insulator MOSFETs, Tezuka et al., *Japanese Journal of Applied Physics*, vol. 40, p 2866-2874, 2001" or in the document "Selectively formed high mobility SiGe on Insulator pMOSFETs with Ge-rich strained surface channels using local condensation technique, Tezuka et al., *Symposium on VLSI Technology*, 2004". To perform this Ge condensation, at least one first step of thermal oxidation of the $Si_{1-x}Ge_x$-based semiconductor layer 104 is performed at high temperature. The oxidation temperature is preferably lower than the melting point of the $Si_{1-x}Ge_x$ material of the semiconductor layer 104. An oxidation in a plurality of steps and at temperatures decreasing between the steps can optionally be performed. In this example, the oxidation is performed on the entire semiconductor layer 104, without the use of masking.

Figure 1B:
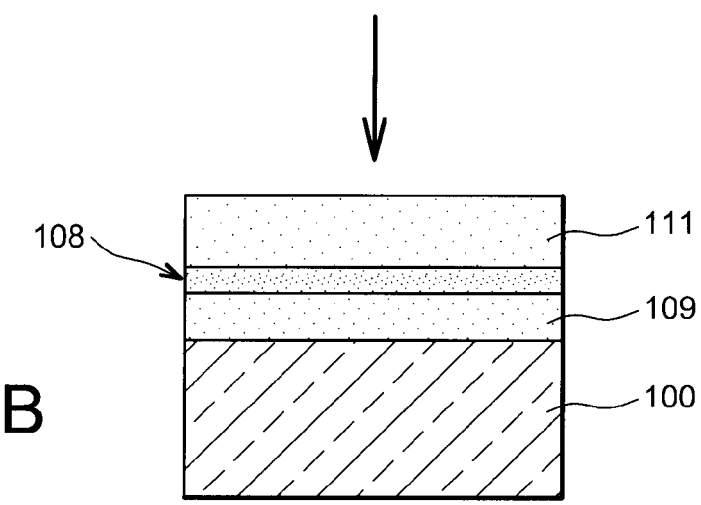
Figure 1C:
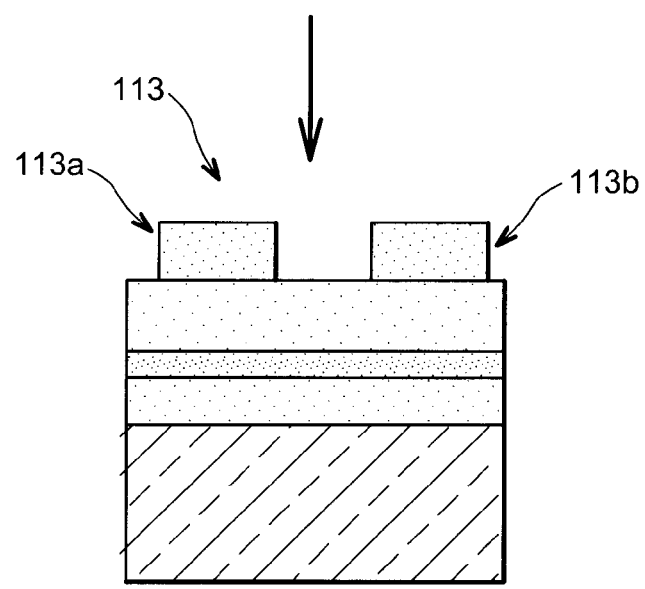

During the oxidation step, the silicon of the first thin semiconductor layer 102, the second thin semiconductor layer 106, and the $Si_{1-x}Ge_x$-based semiconductor layer 104, has a tendency to be consumed, so as to form $SiO_2$. The germanium of the $Si_{1-x}Ge_x$-based semiconductor layer 104 is relatively or completely insoluble in $SiO_2$. Once the oxidation step has been completed, a germanium-enriched $Si_{1-y}Ge_y$-based layer 108 (with y>x) is obtained, having a germanium composition or a germanium content greater than that of the $Si_{1-x}Ge_x$-based semiconductor layer 104. The duration of the oxidation step may have been adapted according to the thickness of and/or the germanium concentration to be obtained in the $Si_{1-y}Ge_y$-based semiconductor layer 108. The $Si_{1-y}Ge_y$-based layer 108 can have a germanium composition for example on the order of 25% or, for example, between 8 and 50%; the size (height) of the wire is also defined here. Once the oxidation step has been completed, the $Si_{1-y}Ge_y$-based layer 108 is located between two insulating $SiO_2$-based layers. The $Si_{1-y}Ge_y$-based layer 108 rests on a first insulating layer 109 formed by the buried $SiO_2$-based oxide layer 101. The $Si_{1-y}Ge_y$-based layer 108 is also superimposed by a second insulating layer 111 resulting from the oxidation of the silicon of the semiconductor layers 106 and 104 (FIG. 1B).

Then, a masking 113 is performed on the second insulating layer 111. The insulating layer 111 can advantageously be removed before masking, by wet processing (for example $HF/H_2O$).

The masking 113 is intended to act as an etching mask and as an oxidation mask for the $Si_{1-y}Ge_y$-based semiconductor layer 108. The masking 113 can be, for example, based on a dielectric material different from that of the second insulating layer 111, for example $Si_3N_4$. The masking 113 comprises a plurality of patterns, and in particular at least one source pattern, at least one drain pattern, and one or more patterns of a structure connecting the source and the drain. The masking 113 can comprise in particular two patterns 113a, 113b (seen according to a transverse cross-section in FIG. 1C) connecting the source and drain patterns. The masking 113 can be formed using at least one photolithography step. The masking operation can include the deposition of a photosensitive resin layer, the definition of patterns in this photosensitive resin layer, then the reproduction of the patterns of the resin layer in a dielectric material layer, for example $Si_3N_4$ deposited previously on the second insulating layer 111. The reproduction of the patterns in the $Si_3N_4$-based dielectric layer can be performed by dry or wet etching, for example using $H_3PO_4$ or a mixture $CF_4/CH_3F$. The resin layer can then be removed.

Figure 1D:
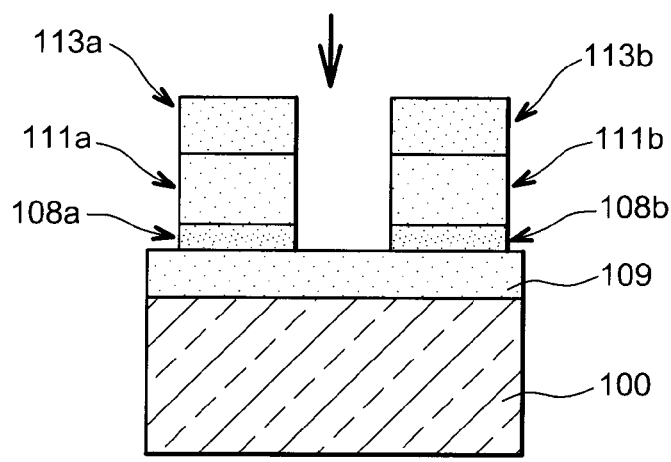
Figure 1E:
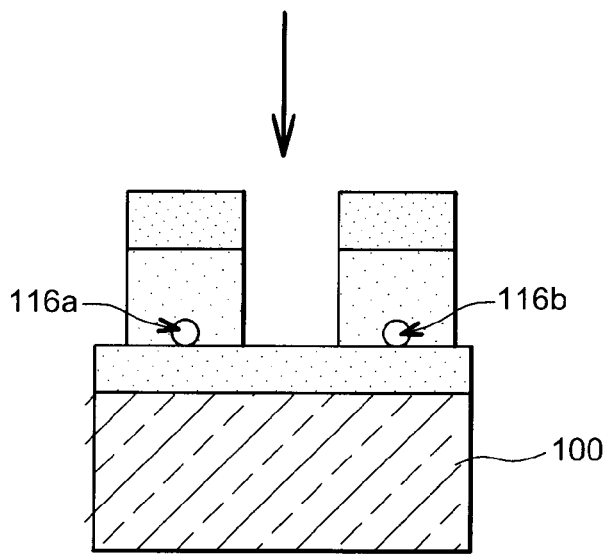

Then, one or more etchings, for example anisotropic etchings, are produced through the masking 113, so as to reproduce the design of the masking and in particular the patterns 113a, 113b in the second insulating layer 111 and in the $Si_{1-y}Ge_y$-based semiconductor layer 108. The etching of the insulating layer 111 can be performed, for example, using a mixture $CF_4/CH_2F_2$, while the etching of the $Si_{1-y}Ge_y$-based layer can be performed for example with $HBr/O_2$. The etching of the semiconductor layer 108 is preferably performed with a stop on the first insulating layer 109. After the etching of the layer 108, so-called semiconductor "connection" blocks 108a, 108b based on $Si_{1-y}Ge_y$, are formed and respectively superimposed by patterns 111a, 111b provided in said second insulating layer 111 (FIG. 1D).

The $Si_{1-y}Ge_y$-based semiconductor connection blocks 108a, 108b each connect a $Si_{1-y}Ge_y$-based semiconductor block intended to form a source region and a $Si_{1-y}Ge_y$-based semiconductor block intended to form a drain region.

Advantageously, but secondarily, the sides can be protected by a thin layer dielectric material, for example $SiO_2$ over several nanometers, for example between 1 and 5 nm.

Then, another step of germanium condensation of the $Si_{1-y}Ge_y$-based semiconductor blocks 108a and 108b is performed. To carry out this Ge condensation, at least one step of thermal oxidation of the $Si_{1-y}Ge_y$-based semiconductor blocks 108a and 108b is performed at high temperature. The condensation, or oxidation, performed is a lateral condensation or a lateral oxidation of the semiconductor blocks 108a, 108b, with the latter being superimposed by patterns 111a, 111b of $SiO_2$ and 113a, 113b of the oxidation masking 113. The oxidation temperature is preferably lower than the melting point of the $Si_{1-y}Ge_y$ material of the semiconductor blocks 108. An oxidation in one or more steps and at decreasing temperatures can be performed. During the lateral oxidation, the width (defined in a direction parallel to the vector $\vec{i}$ of an orthogonal reference [O; $\vec{i}$; $\vec{j}$; $\vec{k}$]) of the semiconductor blocks 108a, 108b is reduced. The oxidation step is prolonged until $Si_{1-z}Ge_z$-based semiconductor wires 116a, 116b (with z>y>x) replacing the semiconductor blocks 108a, 108b are obtained. The wires 116a, 116b, have a germanium composition or a germanium content greater than that of the $Si_{1-y}Ge_y$-based semiconductor blocks 108a, 108b. The wires 116a, 116b can have a critical dimension or a width (measures in a direction parallel to the vector $\vec{i}$ of an orthogonal reference [O; $\vec{i}$; $\vec{j}$; $\vec{k}$]) for example on the order of 10 nm, or for example between 1 nanometer and 100 nanometers. The duration of the lateral oxidation step may have been adapted according to the lateral thickness and the germanium concentration to be obtained in the wires 116a, 116b. The $Si_{1-z}Ge_z$-based wires 116a, 116b can have a germanium composition such that z is for example between 0.5 and 1. The wires 116a, 116b obtained after lateral oxidation are surrounded by an insulating $SiO_2$ material. These wires 116a, 116b are intended to form a channel or multichannel structure of a transistor, and connect a first semiconductor block (not shown) intended to form a source region of the transistor and another semiconductor block (not shown) intended to form a drain region of the transistor.

A thinning of the insulating $SiO_2$-based material can then be performed so as to form a dielectric gate layer. Then, steps of depositing a gate material layer, for example TiN and/or polycrystalline silicon, followed by etching of the gate material layer, can be performed so as to form a gate for the transistor.

An alternative of the example of the method described above will now be given in reference to FIGS. 2A to 2D and 3A and 3B. This alternative is intended for the production of a microelectronic device equipped with one or more $Si_{1-z}Ge_z$-based semiconductor wires connecting a source semiconductor zone and a drain semiconductor zone based on a different semiconductor material than that of the wires, having, for example, a germanium concentration below that of said wires and/or a silicon concentration higher than that of said wires.

Figure 2A:
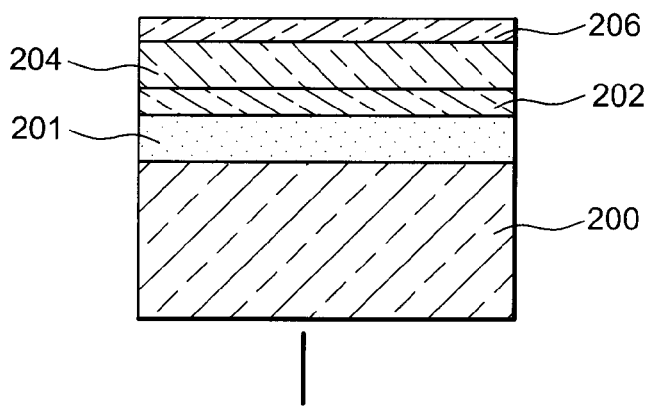
FIGS. 2A to 2D and 3A to 3B show, respectively in a cross-section view and in a top view, an alternative of the method according to the invention for producing a microelectronic device equipped with one or more $Si_{1-z}Ge_z$-based semiconductor wire(s) capable of forming a transistor channel structure.

The starting material of the method can be a semiconductor on insulator substrate, of the type in the example of the method described above, including a support layer 200, for example based on Si, covered with a dielectric material layer 201, for example a buried oxide layer covered with a thin Si-based semiconductor layer 202, itself covered with a $Si_{1-x}Ge_x$-based semiconductor layer 204, with $0<x<y\leq1$, for example with x being between 0.05 and 0.5, or on the order of 0.1 or 0.3 and with a thickness between 40 and 75 nanometers. On the $Si_{1-x}Ge_x$-based semiconductor layer 204, a second, superficial or so-called "cap", thin Si-based semiconductor layer can also be formed. The second thin layer 206 can have a thickness, for example, between 0.5 nanometers and several dozen nanometers, for example on the order of 2 nanometers and produced by epitaxy (FIG. 2A).

Figure 2B:
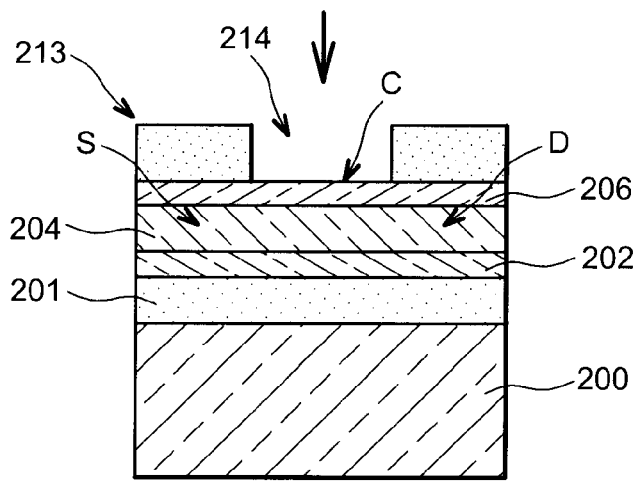

Then, a first masking 213 is produced on the thin semiconductor layer 206. The first masking 213 is intended to serve as an oxidation masking, and is provided for blocking or slowing oxidation of portions of the semiconductor layers 202, 204, 206 covered by the latter, in a step of germanium condensation by thermal oxidation. The first masking 213 can be formed for example by depositing a layer of dielectric material, for example $Si_3N_4$, then by producing at least one opening 214 in this layer of dielectric material (FIG. 2B).

The opening 214 exposes a so-called semiconductor "connection" block C including a portion of the thin Si-based layer 202, covered by a portion of the $Si_{1-x}Ge_x$-based layer 204, itself covered by a portion of the thin Si-based layer 206. The semiconductor block C connects a semiconductor block S, in which a transistor source region is intended to be produced, and another semiconductor block D in which a transistor drain region is intended to be produced. Then a step of localised condensation of the Ge of the $Si_{1-x}Ge_x$-based semiconductor layer 204 is performed, and in particular the portion of the $Si_{1-x}Ge_x$-based semiconductor layer 204 belonging to the semiconductor block C.

To carry out this Ge condensation, at least one step of localised thermal oxidation of the $Si_{1-x}Ge_x$-based semiconductor layer 204 is performed at high temperature through the opening 214. The oxidation temperature is preferably below the melting point of the $Si_{1-x}Ge_x$ material of the semiconductor layer 204. An oxidation in one or more steps and at decreasing temperatures can be performed. During the oxidation step, the silicon of the portions of the semiconductor layers 206, 204, 202 exposed by the opening 214 has a tendency to be consumed, so as to form $SiO_2$. The germanium of the semiconductor layer 204 is relatively or completely insoluble in $SiO_2$. Once the oxidation step has been completed, a $Si_{1-y}Ge_y$-based semiconductor block C' (with y>x) is obtained, which is exposed by the opening 214 and having a germanium composition or a germanium content higher than those of the $Si_{1-x}Ge_x$-based semiconductor layer 204. The composition after oxidation, of the semiconductor zones located under the masking 213 is dependent on the chosen thickness and/or composition of this masking 213. According to one possibility, after oxidation, the semiconductor zones located under the masking 213 and in particular the semiconductor blocks S and D intended to respectively form a source region and a drain region can have a composition identical or similar to that which they had before oxidation. According to another possibility, the semiconductor blocks S and D located under the masking 213 may have undergone a slight oxidation, while having a germanium concentration below that of the $Si_{1-y}Ge_y$-based semiconductor block C'.

Figure 2C:
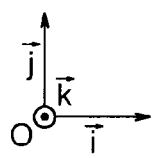
Figure 2C:
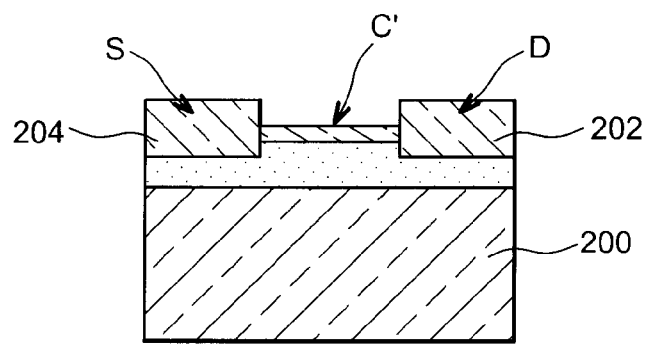

The duration of the oxidation step may have been adapted according to the thickness and/or the germanium concentration to be obtained in the $Si_{1-y}Ge_y$-based semiconductor block C'. Then, a step of de-oxidation, in which the $SiO_2$-based zones resulting from the oxidation of the silicon of layers 204 and 206 is removed, can be carried out. The de-oxidation can be performed, for example, with a diluted HF-based solution (FIG. 2C).

Figure 2D:
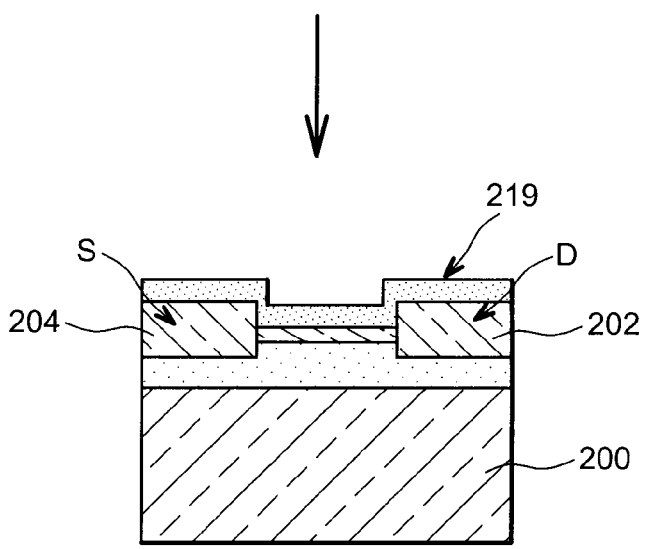
Figure 3B:
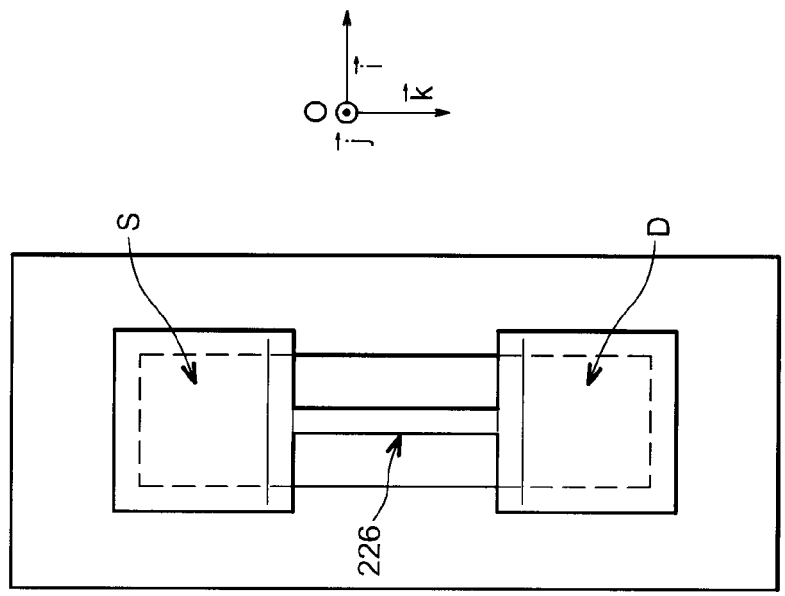
Figure 3A:
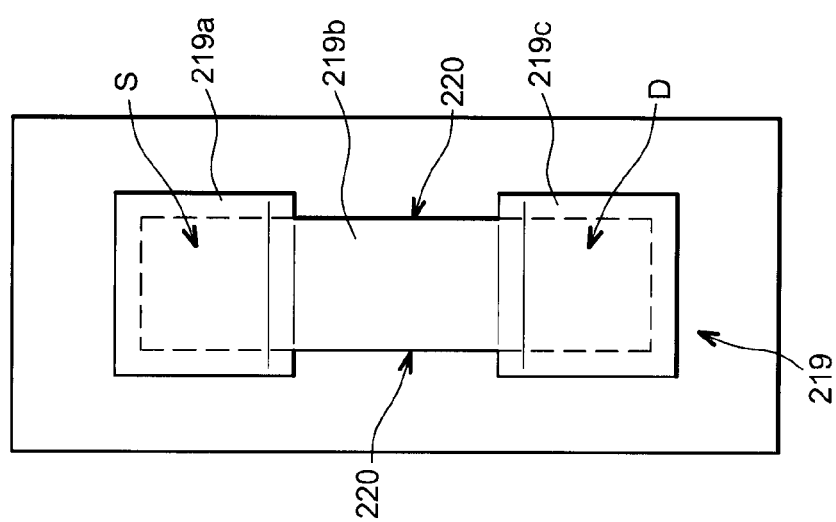

Then, a layer of dielectric material is deposited on the semiconductor layers, for example $Si_3N_4$, then patterns of a second masking 219 in this dielectric material are defined by etching up to the buried oxide insulating layer 201 (FIG. 2D). The second masking 219 can comprise at least one portion 219a superimposing and covering the sides of the semiconductor transistor source region block S, at least one other portion 219b superimposing and covering the sides of the semiconductor transistor drain region block D and at least one pattern 219c superimposing the semiconductor block C' connecting the source region and the drain region and the sides of the semiconductor block C'. The second masking is performed so that the sides 220 of the $Si_{1-y}Ge_y$-based semiconductor block C' are exposed (FIG. 3A, the device being shown from the top view in this figure).

Then, a second step of germanium condensation is performed through the second masking 219. The condensation comprises at least one step of thermal oxidation of the sides 220 of the $Si_{1-y}Ge_y$-based semiconductor block C'. During the oxidation step, the silicon of the $Si_{1-y}Ge_y$-based semiconductor block C' has a tendency to be consumed, so as to form $SiO_2$. The germanium is relatively or completely insoluble in $SiO_2$. The lateral oxidation of the $Si_{1-y}Ge_y$-based semiconductor block C' is prolonged until a semiconductor zone or a $Si_{1-z}Ge_z$-based semiconductor wire 226 (with z>y>x) with a germanium composition or a germanium content greater than that of the $Si_{1-y}Ge_y$-based semiconductor block C' is obtained instead. The wire 226 also has a critical dimension or a width (measures in a direction parallel to the vector $\vec{i}$ of an orthogonal reference [O; $\vec{i}$ ; $\vec{j}$ ; $\vec{k}$ ]) lower than that of the semiconductor block C'. The wire 226 can have a width or a critical dimension, for example, on the order of 10 nm, or for example between 1 nanometer and 100 nanometers. The duration of the lateral oxidation step may have been adapted according to the thickness of the wire and/or the germanium concentration to be obtained in the wire 226. The $Si_{1-z}Ge_z$-based wire 226 may have a germanium composition such that z is for example of the order of 1 (between 0.5 and 1). The $Si_{1-z}Ge_z$-based wire 226 connects a semiconductor block S intended to form a transistor source region and a semiconductor block D intended to form a transistor drain region, each having a germanium concentration below that of the wire 226.

It is also possible for a microelectronic device equipped with one or more $Si_{1-z}Ge_z$-based semiconductor wire(s) (with 0<z≦1) to be obtained by first performing a lateral thermal oxidation of the sides, then a thermal oxidation of at least a portion of the semiconductor layer, which steps can be performed as in the examples described above.

The invention claimed is:

1. A method for producing a microelectronic device, comprising one or more $Si_{1-z}Ge_z$ based semiconductor wire(s) (with 0<z≦1), said method comprising:
   a) thermal oxidation of at least a portion of a $Si_{1-x}Ge_x$-based semiconductor layer (with 0<x<1) resting on a support, so as to form at least one $Si_{1-y}Ge_y$-based semiconductor zone (with 0<y<1 and x<y), and
   b) lateral thermal oxidation of the sides of one or more so-called semiconductor "connection" blocks from said $Si_{1-y}Ge_y$-based semiconductor zone and connecting a semiconductor block intended to form a transistor source region and another block intended to form a transistor drain region so as to reduce the semiconductor connection blocks in at least one direction parallel to the main plane of the support and to form one or more $Si_{1-z}Ge_z$-based semiconductor wire(s) (with 0<y<1 and y<z).

2. The method according to claim 1, wherein the $Si_{1-x}Ge_x$-based semiconductor layer rests on a Si-based layer.

3. The method according to claim 2, wherein the support is a SOI substrate and the Si-based layer belongs to said SOI substrate and rests on a buried oxide layer of the SOI substrate.

4. The method according to claim 2, wherein the $Si_{1-x}Ge_x$ based semiconductor layer is covered with another Si-based layer.

5. The method according to claim 4, wherein the thermal oxidation of at least a portion of the semiconductor layer is an oxidation of the entire semiconductor layer.

6. The method according to claim 4, wherein the thermal oxidation of at least a portion of the semiconductor layer is a localised oxidation of the semiconductor layer, performed through at least one opening of an oxidation mask.

7. The method according to claim 1, wherein the thermal oxidation of at least a portion of the semiconductor layer is an oxidation of the entire semiconductor layer.

8. The method according to claim 7, wherein, between a) and b), the method further comprises:
   etching the semiconductor layer, through a mask, so as to produce the semiconductor connection block(s) and the semiconductor block intended to form the transistor source region and the other semiconductor block intended to form a transistor drain region.

9. The method according to claim 1, wherein the thermal oxidation of at least a portion of the semiconductor layer is a localised oxidation of the semiconductor layer, performed through at least one opening of an oxidation mask.

10. The method according to claim 1, wherein, between a) and b), the method further comprises:
    etching the semiconductor layer, through a mask, so as to produce the semiconductor connection block(s) and the semiconductor block intended to form the transistor source region and the other semiconductor block intended to form a transistor drain region.

11. The method according to claim 1, wherein, in the lateral thermal oxidation of the sides of one or more block(s) semiconductor connection block(s), the semiconductor block intended to form the transistor source region and the other semiconductor block intended to form a transistor drain region are superimposed by an oxidation mask.

12. The method according to claim 11, wherein the oxidation mask covers the sides of the semiconductor block intended to form a source region and the semiconductor block intended to form a drain region.

13. A method for producing a microelectronic device, comprising one or more $Si_{1-z}Ge_z$-based semiconductor wire(s) (with $0<z\leq1$), said method comprising:
   a) lateral thermal oxidation of the sides of one or more semiconductor "connection" blocks of a $Si_{1-x}Ge_x$-based semiconductor layer (with $0<x<1$) resting on a support and connecting a semiconductor block intended to form a transistor source region and another block intended to form a transistor drain region so as to reduce the semiconductor connection blocks in at least one direction parallel to the main plane of the support and to form one or more $Si_{1-y}Ge_y$ based semiconductor wire(s) (with $0<y<1$ and $x<y$), and
   b) thermal oxidation of at least a portion of the semiconductor layer, so as to form at least one $Si_{1-y}Ge_y$-based semiconductor zone comprising the semiconductor connection blocks, with the semiconductor of the wires then being based on $Si_{1-z}Ge_z$ (with $0<y<1$ and $y<z$).

14. The method according to claim 13, wherein $Si_{1-x}Ge_x$-based semiconductor layer rests on a Si-based layer.

15. The method according to claim 14, wherein the support is a SOI substrate and the Si-based layer belongs to said SOI substrate and rests on a buried oxide layer of the SOI substrate.

16. The method according to claim 14, wherein the $Si_{1-x}Ge_x$ based semiconductor layer is covered with another Si-based layer.

17. The method according to claim 13, wherein the thermal oxidation of at least a portion of the semiconductor layer is an oxidation of the entire semiconductor layer.

18. The method according to claim 13, wherein the thermal oxidation of at least a portion of the semiconductor layer is a localised oxidation of the semiconductor layer, performed through at least one opening of an oxidation mask.

19. The method according to claim 13, wherein, between a) and b), the method further comprises:
   etching the semiconductor layer, through a mask, so as to produce the semiconductor connection block(s) and the semiconductor block intended to form the transistor source region and the other semiconductor block intended to form a transistor drain region.

20. The method according to claim 13, wherein, in the lateral thermal oxidation of the sides of one or more block(s) semiconductor connection block(s), the semiconductor block intended to form the transistor source region and the other semiconductor block intended to form a transistor drain region are superimposed by an oxidation mask.

* * * * *